United States Patent
Lee et al.

(10) Patent No.: US 8,003,195 B2
(45) Date of Patent: Aug. 23, 2011

(54) METHOD FOR MANUFACTURING DISPLAY DEVICE

(75) Inventors: Seokwoo Lee, Bucheon-si (KR); Suhyuk Kang, Seoul (KR)

(73) Assignee: LG. Display Co. Ltd., Seoul (KR)

( * ) Notice: Subject to any disclaimer, the term of this patent is extended or adjusted under 35 U.S.C. 154(b) by 112 days.

(21) Appl. No.: 12/338,210

(22) Filed: Dec. 18, 2008

(65) Prior Publication Data

US 2009/0325332 A1    Dec. 31, 2009

(30) Foreign Application Priority Data

Jun. 26, 2008    (KR) .................. 10-2008-0060946

(51) Int. Cl.
*H01L 21/84*    (2006.01)

(52) U.S. Cl. .............................. 428/166; 257/E21.412
(58) Field of Classification Search .................. 438/159
See application file for complete search history.

(56) References Cited

U.S. PATENT DOCUMENTS

| | | | | |
|---|---|---|---|---|
| 5,982,471 A | * | 11/1999 | Hirakata et al. | 349/155 |
| 6,197,625 B1 | * | 3/2001 | Choi | 438/158 |
| 2006/0024866 A1 | | 2/2006 | Gan et al. | 438/149 |

OTHER PUBLICATIONS

Office Action issued in corresponding Chinese Patent Application No. 200810189431.1; issued Jul. 13, 2010.

* cited by examiner

*Primary Examiner* — Chandra Chaudhari
(74) *Attorney, Agent, or Firm* — Brinks Hofer Gilson & Lione

(57) ABSTRACT

A method for manufacturing a display device includes forming an active layer by performing an SPC (solid phase crystallization) process on a first substrate; forming a cushioning layer of amorphous silicon (a-Si) on the active layer under an atmosphere containing about 90 to about 97% by flow rate of hydrogen (H2) and about 10 to about 3% by flow rate of silane (SiH4); forming an N-type impurity layer on the cushioning layer; forming a metal layer to cover the N-type impurity layer; forming a source and drain by removing the metal film by a first etching method; and separating the N-type impurity layer and the cushioning layer by a second etching method.

12 Claims, 4 Drawing Sheets

METHOD FOR MANUFACTURING DISPLAY DEVICE

RELATED APPLICATIONS

This application claims the benefit of Korean Patent Application No. 10-2008-0060946 field on Jun. 26, 2008, which is hereby incorporated by reference in its entirety.

BACKGROUND

1. Field

This document relates to a manufacturing method for a display device.

2. Related Art

As information technology develops, the demand for display devices that are connecting media between users and information is increasing. Hence, the need for flat panel displays (FPDs) such as liquid crystal displays (LCDs), organic light emitting displays (OLEDs), and plasma display panels (PDPs), is increasing.

Here, the liquid crystal displays or organic light emitting diodes can be realized in a thin film configuration, and are classified for production purpose into small size display devices mounted on a mobile phone, a digital camera and the like and large size display devices mounted on a television, a monitor and the like.

A liquid crystal display or organic light emitting display uses a transistor array disposed on a first substrate. Transistors included in the transistor array comprise a gate, an active layer, a source, and a drain. The transistors included in the transistor array have an enormous effect on the reliability, display quality, and lifespan of the liquid crystal display or organic light emitting display.

A conventional transistor array structure using an SPC (solid phase crystallization) film as an active layer has the problem that micro-peeling easily occurs in the process of forming an N-type impurity layer on a crystallization film after crystallization, which peels the N-type impurity layer off from the active layer.

When micro-peeling occurs as discussed above, the corresponding region acts as a particle source. Thus, the subsequent process cannot be performed, and even if the subsequent process is performed, the device becomes uneven. Therefore, a solution of this problem is needed.

BRIEF SUMMARY

An aspect of this document is to provide a manufacturing method for a display device, comprising: forming an active layer by performing an SPC (solid phase crystallization) process on a first substrate; forming a cushioning layer of amorphous silicon (a-Si) on the active layer under an atmosphere containing about 90 to about 97% by flow rate of hydrogen (H2) and about 10 to about 3% by flow rate of silane (SiH4); forming an N-type impurity layer on the cushioning layer; forming a metal layer to cover the N-type impurity layer; forming a source and drain by removing the metal film by a first etching method; and separating the N-type impurity layer and the cushioning layer by a second etching method.

BRIEF DESCRIPTION OF THE DRAWINGS

The accompanying drawings, which are included to provide a further understanding of the invention and are incorporated on and constitute a part of this specification illustrate embodiments of the invention and together with the description serve to explain the principles of the invention.

DETAILED DESCRIPTION OF THE DRAWINGS AND THE PRESENTLY PREFERRED EMBODIMENTS

Reference will now be made in detail embodiments of the invention examples of which are illustrated in the accompanying drawings.

A manufacturing method for a display device according to one exemplary embodiment of the present invention will be described below.

Figure 1:
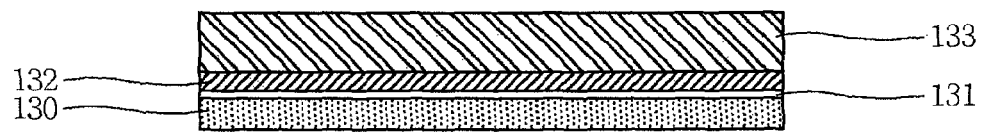
FIGS. 1 to 3 are cross sectional views for explaining a manufacturing method for a display device according to one exemplary embodiment of the present invention.

First, as shown in FIG. 1, the step of forming an active layer 130 by performing an SPC (solid phase crystallization) process on a first substrate 110 is performed. Here, the active layer 130 formed on the first substrate 110 may be an a-SPC which is of an amorphous type.

Next, as shown in FIG. 1, the step of forming a cushioning layer 131 of amorphous silicon (a-Si) on the active layer 130 under an atmosphere containing about 90 to about 97% by flow rate of hydrogen (H$_2$) and about 10 to about 3% by flow rate of silane (SiH4) is performed.

Next, as shown in FIG. 1, the step of forming an N-type impurity layer 132 on the cushioning layer 131 is performed.

Next, as shown in FIG. 1, the step of forming a metal layer 133 to cover the N-type impurity layer is performed.

Figure 2:
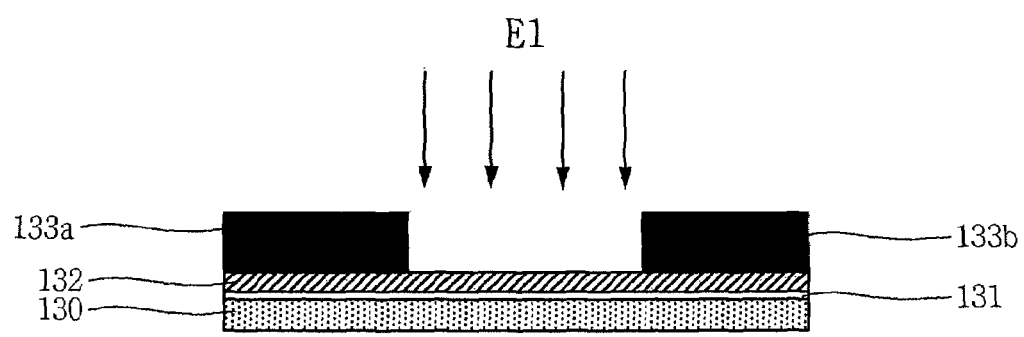

Next, as shown in FIG. 2, the step of forming a source 133*a* and drain 133*b* by removing the metal film 133 by a first etching method E1 is performed. Here, the first etching method E1 may be wet etching (W/E), but is not limited thereto.

Figure 3:
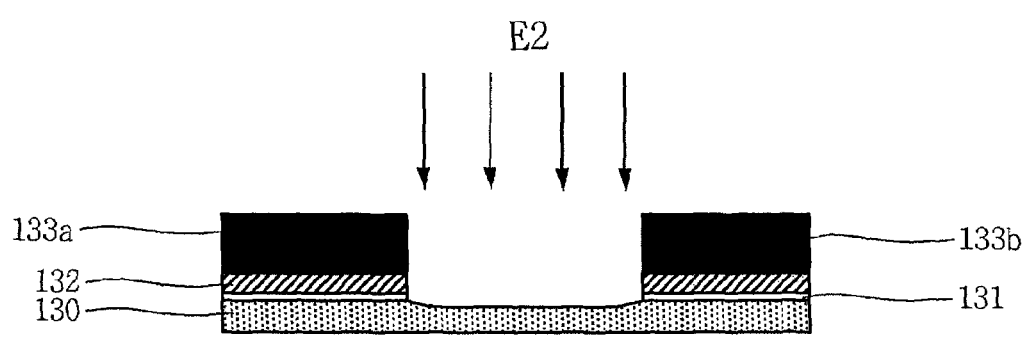

Next, as shown in FIG. 3, the step of separating the N-type impurity layer 132 and the cushioning layer 133 by a second etching method E2 is performed. Here, the second etching method E2 may be dry etching (D/E), but is not limited thereto.

The above-explained process may comprise the step of removing a thermal oxide film formed upon crystallization of the active layer 130 by BOE (buffered oxide etchant) cleaning after the active layer 130 forming step.

By performing this process, a transistor as shown in the following FIGS. 4 and 5 can be formed through subsequent processes.

Figure 4:
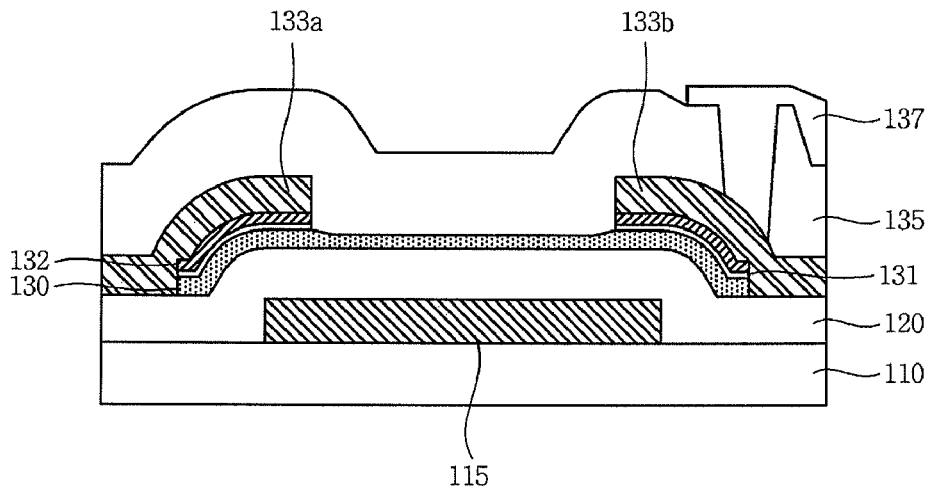
FIGS. 4 and 5 are illustrations of a cross section of a transistor.

First, FIG. 4 shows a transistor formed in an inverted staggered bottom gate structure.

In order to form an inverted staggered bottom gate type transistor, before the active layer 130 forming step, the step of forming a gate 115 on the first substrate 110 is performed, and the step of forming a first insulating film 120 on the gate 115 is performed. Then, an active layer 130, a cushioning layer 131, an N-type impurity layer 132, and a metal layer 133 are formed on the first insulating film 120, the metal layer 133 is formed by a source 133a and a drain 133b by using a first etching method, and the N-type impurity layer 132 and the cushioning layer 131 are separated from each other by using a second etching method. Then, the step of forming a second insulating film 135 on the source 133a and drain 133b is performed, and the step of forming a first electrode 137 on the second insulating film 135 to be connected to the source 133a or drain 133b is performed.

Figure 5:
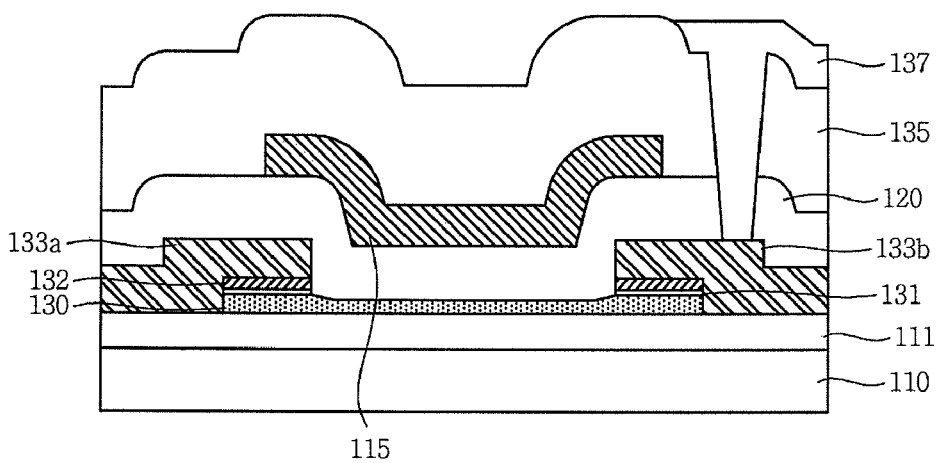

Next, FIG. 5 shows a transistor formed in a coplanar top gate structure.

In order to form a coplanar top gate type transistor, an active layer 130, a cushioning layer 131, an N-type impurity layer 132, and a metal layer 133 are formed on a first substrate 110, the metal layer 133 is formed by a source 133a and a drain 133b by using a first etching method, and the N-type impurity layer 132 and the cushioning layer 131 are separated from each other by using a second etching method. After the separation step, the step of forming a first insulating film 120 on the source 133a and drain 133b is performed, and the step of forming a gate 115 on the first insulating film 120 is performed. Then, the step of forming a second insulating film 135 on the first insulating film 120 to cover the gate 115 is performed, and the step of forming a first electrode 137 on the second insulating film 135 to be connected to the source 133a or drain 133b is performed. Here, a cushioning layer 111 may be disposed between the first substrate 110 and the active layer 130.

Figure 6:
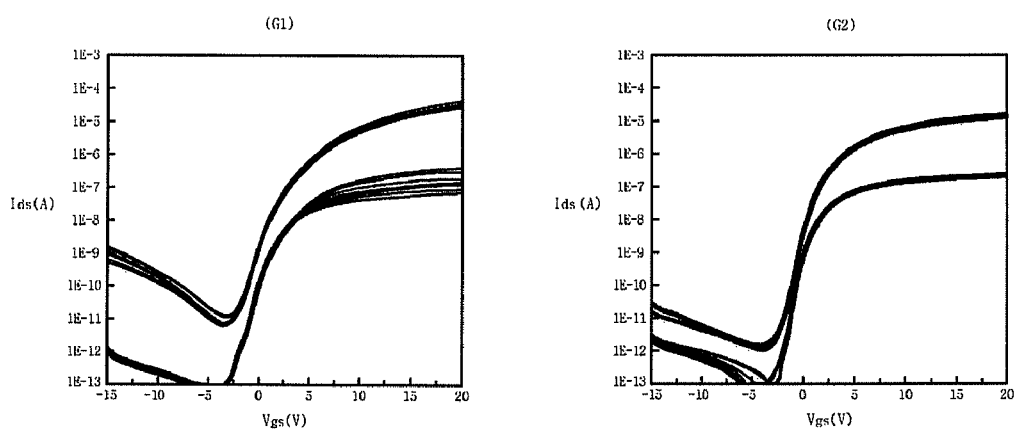
FIG. 6 is a comparison drawing of the IV curve of a transistor manufactured according to one exemplary embodiment of the present invention.

By forming a transistor as shown in FIGS. 4 and 5 by using one exemplary embodiment of the present invention as seen from above, IV curves of transistors can be improved as shown in FIG. 6. Here, (G1) of FIG. 6 is the IV curve of a conventional transistor, and (G2) of FIG. 6 is the IV curve of a transistor manufactured by the manufacturing method according to one exemplary embodiment of the present invention.

Meanwhile, in the manufacturing method of the present invention, a cushioning layer 131 of amorphous silicon (a-Si) is formed on the active layer 130 under an atmosphere containing about 90 to about 97% by flow rate of hydrogen ($H_2$) and about 10 to about 3% by flow rate of silane (SiH4).

In this process, if the flow rate of hydrogen (H2) is increased and the flow rate of silane (SiH4) is decreased compared to a general a-Si deposition condition, the amount of silicon radicals (Si radicals) is relatively decreased, thereby drastically slowing down the deposition rate of an a-Si layer.

However, under the condition of the aforementioned slow deposition speed, if a cushioning layer 131 of a-Si is deposited on top of the active layer 130 formed of an SPC crystallization film and an N-type impurity layer 132 of n+ a-Si is formed on the cushioning layer 131, interlayer lattice mismatch is reduced and adhesion force is improved, thereby preventing the occurrence of micro-peeling.

Generally, an internal stress of a thin film is very large, i.e., about $10^9$~$10^{10}$ dynes/cm$^2$. Thus, if adhesion force on the interface between a film and a substrate is formed simply by physical adsorption, this may cause peeling. Such an internal stress is formed by lattice mismatch between a substrate and a deposition film, a fast deposition speed, an impurity layer contained in the film, and so forth.

However, if the method according to one exemplary embodiment of the present invention is carried out, the presence rate of an impurity layer between the active layer 130 formed of an SPC crystallization film and the N-type impurity layer 132 is lowered, so that the effect of lattice mismatch becomes smaller. Further, problems such as micro-peeling can be suppressed by forming a cushioning layer 131 of a-Si on the active layer 130 at a slow deposition speed.

The thickness of the cushioning layer 131 is 10 to 300 Å.

Here, the purpose of formation of the N-type impurity layer 132 is to provide an ohmic contact at the source 133a and drain 133b ends of the transistor device.

If the cushioning layer 131 is formed at 10 Å or more, it serves as a physical buffer and ohmic contact between the active layer 130 and the N-type impurity layer 132, and can suppress micro-peeling. If the cushioning layer 131 is formed at 300 Å or less, it serves as an electrical offset to thus reduce leakage current, and serves as a buffer and an ohmic contact. However, if the cushioning layer 131 is formed thicker than 300 Å, for example, at 400 or 500 Å, the resistance increases in proportion to the thickness, and this may result in degrading the device characteristics.

After the above-explained process, the step of forming a display panel by providing a second substrate spaced apart from and opposed to the first substrate and bonding the first and second substrates may be performed to manufacture a display device.

Hereinafter, a display device manufactured by using the above-explained transistor will be described.

Figure 7:
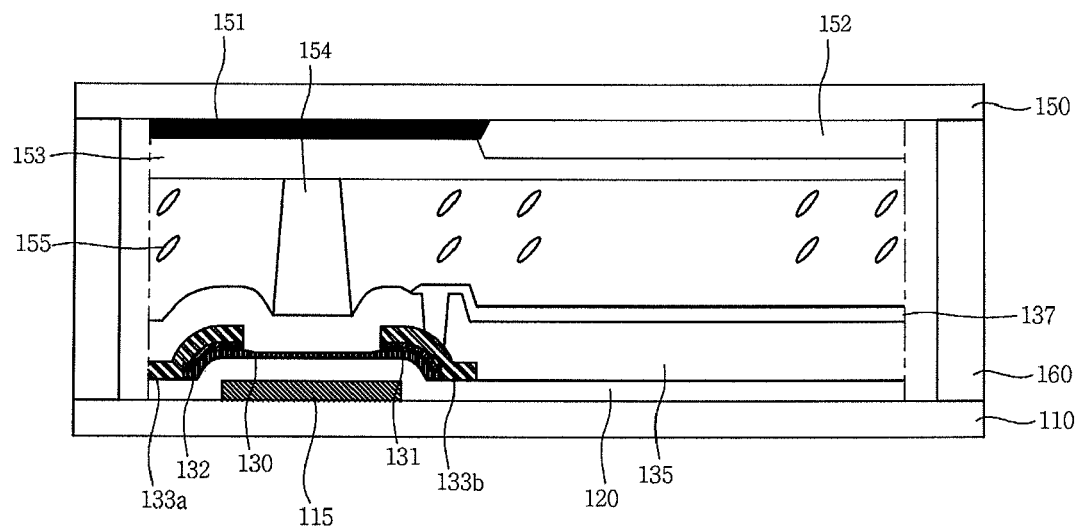
FIG. 7 is an illustration of a liquid crystal display using an inverted staggered bottom gate type transistor.

First, a liquid crystal display using an inverted staggered bottom gate type transistor as shown in FIG. 7 can be formed as described below.

A gate 115 may be disposed on one surface of a first substrate 110. A first insulating film 20 may be disposed on the gate 115. An amorphous active layer 130 formed by an SPC process may be disposed on the first insulating film 120 so as to be disposed in a region corresponding to the gate 115. A cushioning layer 131 may be disposed on the active layer 130, and an N-type impurity layer 132 serving as an ohmic contact may be disposed on the cushioning layer 131. A source 133a and drain 133b may be disposed on the N-type impurity layer 132. A second insulating film 135 may be disposed on the source 133a and drain 133b. A first electrode 137 connected to the source 133a and drain 33b may be disposed on the second insulating film 135.

Further, a common electrode (not shown) facing the first electrode 137 may be disposed on the second insulating film 135. Such a common electrode may be disposed on the first substrate 110 and second substrate 150.

A spacer 154 for maintaining a cell gap from the second substrate 150 may be disposed on the second insulating film 135 disposed on the first substrate 110 and corresponding to the source 133a and drain 133b.

A black matrix 151 may be disposed on one surface of the second substrate 150. The black matrix 151 is a non-display region, which may be disposed so as to correspond to the region in which the spacer 154 is disposed. A color filter 52 may be disposed between the black matrix 151. The color filter 152 may be of other colors in addition to red, green, and blue.

An overcoating layer 153 may be disposed on the black matrix 151 and the color filter 152. The second substrate 150 having the black matrix 151 and color filter 152 formed thereon may omit the overcoating layer 153 according to its structure.

The first substrate 110 and the second substrate 150 may be bonded together by an adhesive member 160, and a liquid crystal layer 155 may be formed between the first substrate 110 and the second substrate 150, thereby completing a display panel. Here, the liquid crystal layer 155 may be formed in a different form according to the driving mode of the display panel. Further, the first electrode 137 and the common electrode also may be formed in a different from according to the driving mode of the display panel.

Figure 8:
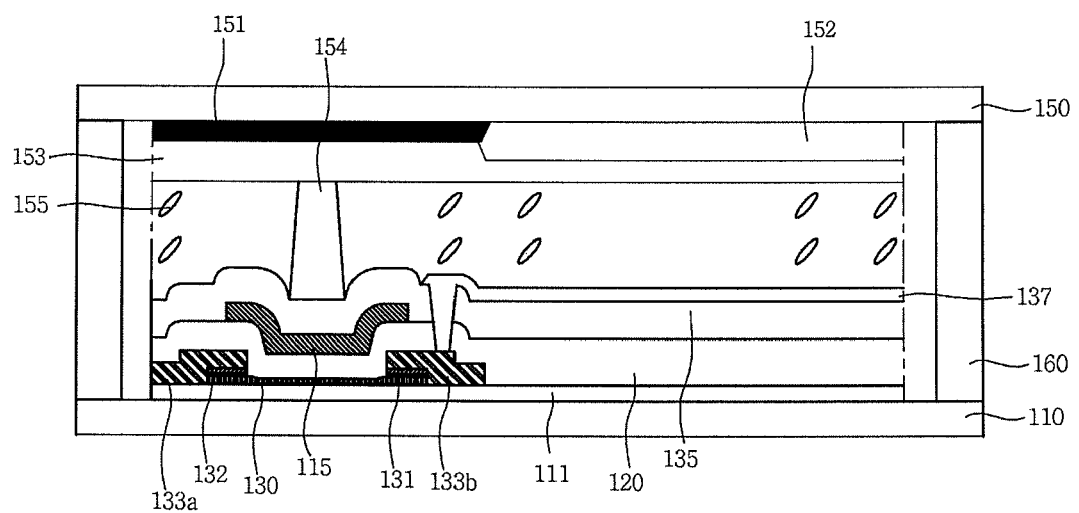
FIG. 8 is an illustration of a liquid crystal display using a coplanar top gate type transistor.

Next, a liquid crystal display using a coplanar top gate type transistor as shown in FIG. 8 can be formed as described below.

An amorphous active layer 130 formed by an SPC process may be disposed on one surface of a first substrate 110. A cushioning layer 131 may be disposed on the active layer 130, and an N-type impurity layer 132 serving as an ohmic contact may be disposed on the cushioning layer 131.

Here, a buffer layer 111 may be disposed between the first substrate 110 and the active layer 130. A source 133a and drain 133b may be disposed on the N-type impurity layer 132. A first insulating film 120 may be disposed on the source 133a and drain 133b. A gate 114 may be disposed in a region corresponding to the active layer 130 on the first insulating film 120. A second insulating film 135 may be disposed on the gate 115. A first electrode 137 connected to the source 133a and drain 133b may be disposed on the second insulating film 135.

Further, a common electrode (not shown) facing the first electrode 137 may be disposed on the second insulating film 135. Such a common electrode may be disposed on the first substrate 110 and second substrate 150.

A spacer 154 for maintaining a cell gap from the second substrate 150 may be disposed on the second insulating film 135 disposed on the first substrate 110 and corresponding to the source 133a and drain 133b.

A black matrix 151 may be disposed on one surface of the second substrate 150. The black matrix 151 is a non-display region, which may be disposed so as to correspond to the region in which the spacer 154 is disposed. A color filter 52 may be disposed between the black matrix 151. The color filter 152 may be of other colors in addition to red, green, and blue.

An overcoating layer 153 may be disposed on the black matrix 151 and the color filter 152. The second substrate 150 having the black matrix 151 and color filter 152 formed thereon may omit the overcoating layer 153 according to its structure.

The first substrate 110 and the second substrate 150 may be bonded together by an adhesive member 160, and a liquid crystal layer 155 may be formed between the first substrate 110 and the second substrate 150, thereby completing a display panel. Here, the liquid crystal layer 155 may be formed in a different form according to the driving mode of the display panel. Further, the first electrode 137 and the common electrode also may be formed in a different from according to the driving mode of the display panel.

Figure 9:
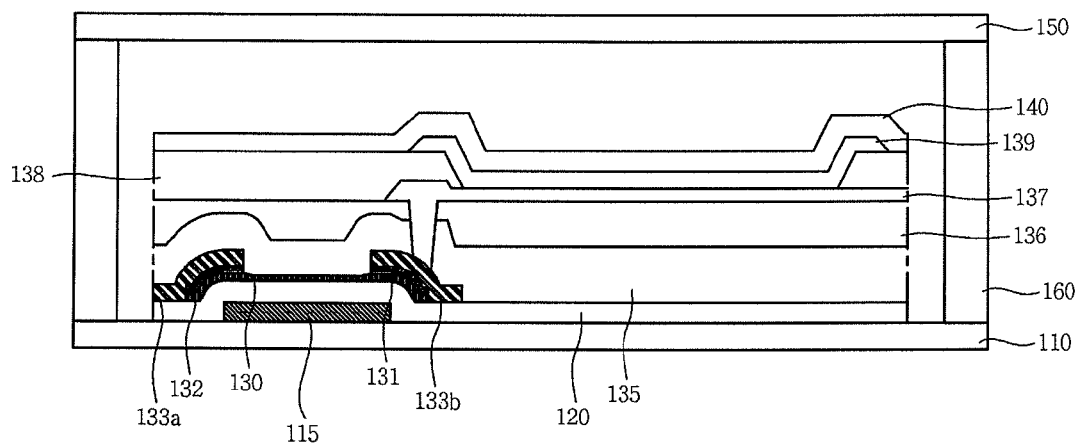
FIG. 9 is an illustration of an organic light emitting display using an inverted staggered bottom gate type transistor.

First, a liquid crystal display using an inverted staggered bottom gate type transistor as shown in FIG. 9 can be formed as described below.

A gate 115 may be disposed on one surface of a first substrate 110. A first insulating film 120 may be disposed on the gate 115. An amorphous active layer 130 formed by an SPC process may be disposed in a region corresponding to the gate 115 on the first insulating film 120. A cushioning layer 131 may be disposed on the active layer 130, and an N-type impurity layer 132 serving as an ohmic contact may be disposed on the cushioning layer 131. A source 133a and drain 133b may be disposed on the N-type impurity layer 132. A second insulating film 135 may be disposed on the source 133a and drain 133b. A first electrode 137 connected to the source 133a and drain 133b may be disposed on the second insulating film 135. The first electrode 137 may be disposed on a third insulating film 136 disposed on the second insulating film 35, but is not limited thereto.

A bank layer 138 having an opening may be disposed on the first electrode 137 so as to expose part of the first electrode 137. An organic light emitting layer 139 may be disposed on the first electrode 137. A second electrode 140 may be disposed on the organic light emitting layer 139. Here, the first electrode 137 and second electrode 140 may be selected as an anode and a cathode respectively according to their light emitting manner.

Since a device formed on the first substrate 110 is weak to moisture or oxygen, a second substrate 150 and an adhesive member 160 may be used to bond the first substrate 110 and the second substrate 150, thereby completing a display panel. Here, a moisture absorbent may be formed between the first substrate 110 and the second substrate 120. Meanwhile, the first electrode 137, organic light emitting layer 139, and second electrode 140 formed on the first substrate 110 may be formed on the second substrate 150. In this case, a device formed on the second substrate 150 may be electrically connected to a transistor or the like formed on the first substrate 110.

Figure 10:
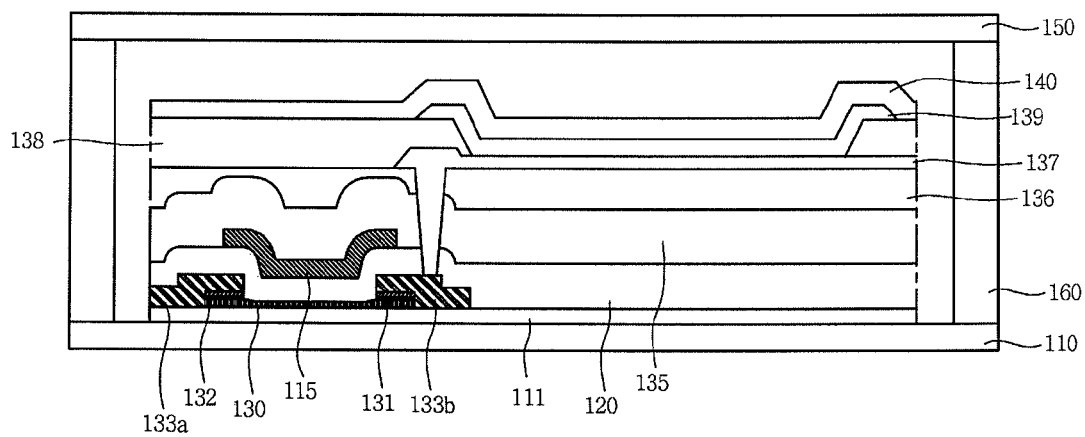
FIG. 10 is an illustration of an organic light emitting display using a coplanar top gate type transistor.

Next, an organic light emitting display using a coplanar top gate type transistor as shown in FIG. 10 can be formed as described below.

An amorphous active layer 130 formed by an SPC process may be disposed on one surface of a first substrate 110. A cushioning layer 131 may be disposed on the active layer 130, and an N-type impurity layer 132 serving as an ohmic contact may be disposed on the cushioning layer 131.

Here, a buffer layer 111 may be disposed between the first substrate 110 and the active layer 130. A source 133a and drain 133b may be disposed on the N-type impurity layer 132. A first insulating film 120 may be disposed on the source 133a and drain 133b. A gate 114 may be disposed in a region corresponding to the active layer 130 on the first insulating film 120. A second insulating film 135 may be disposed on the gate 115. A first electrode 137 connected to the source 133a and drain 133b may be disposed on the second insulating film 135. The first electrode 137 may be disposed on a third insulating film 136 disposed on the second insulating film 35, but is not limited thereto.

A bank layer 138 having an opening may be disposed on the first electrode 137 so as to expose part of the first electrode 137. An organic light emitting layer 139 may be disposed on the first electrode 137. A second electrode 140 may be disposed on the organic light emitting layer 139. Here, the first electrode 137 and second electrode 140 may be selected as an anode and a cathode respectively according to their light emitting manner.

Since a device formed on the first substrate 110 is weak to moisture or oxygen, a second substrate 150 and an adhesive member 160 may be used to bond the first substrate 110 and the second substrate 150, thereby completing a display panel. Here, a moisture absorbent may be formed between the first substrate 110 and the second substrate 120. Meanwhile, the first electrode 137, organic light emitting layer 139, and second electrode 140 formed on the first substrate 110 may be formed on the second substrate 150. In this case, a device formed on the second substrate 150 may be electrically connected to a transistor or the like formed on the first substrate 110.

Figure 11:
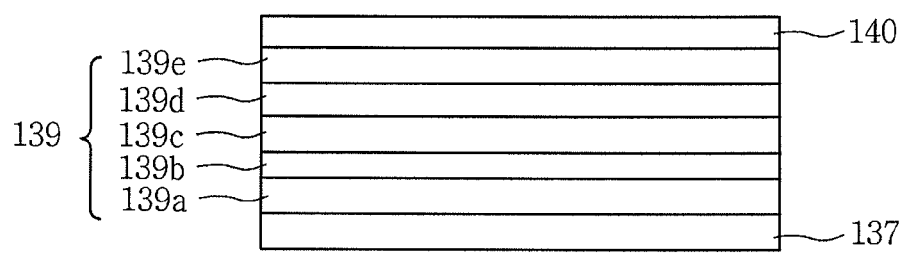
FIG. 11 is an illustration of a hierarchical structure of an organic light emitting diode.

Meanwhile, an organic light emitting diode comprising an organic light emitting layer 139 formed as shown in FIGS. 9 and 10 may have a structure as shown in FIG. 11.

Hereinafter, the organic light emitting diode will be described in more detail with reference to FIG. 11.

A hole injection layer 139a may be disposed on the first electrode 137. The hole injection layer 139a may be formed of one or more selected from the group consisting of copper phthalocyanine (CuPc), PEDOT(poly(3,4)-ethylenedioxythiophene), polyaniline (PANI) and NPD(N,N-dinaphthyl-N,N'-diphenyl benzidine), but is not limited thereto.

A hole transport layer 139b may be disposed on the hole injection layer 139a. The hole transport layer 139b functions to smoothly transport holes. The hole transport layer 139b may be formed of one or more selected from the group consisting of NPD(N,N-dinaphthyl-N,N'-diphenyl benzidine), TPD(N,N'-bis-(3-methylphenyl)-N,N'-bis-(phenyl)-benzidine, s-TAD and MTDATA(4,4',4"-Tris(N-3-methylphenyl-N-phenyl-amino)-triphenylamine), but is not limited thereto.

A light emitting layer 139c may be disposed on the hole transport layer 139b.

The light emitting layer 139c may be formed of a material capable of producing red, green, blue and white light, for example, a phosphorescence material or a fluorescence material.

In case that the light emitting layer 139c produces red light, the light emitting layer 139c includes a host material including carbazole biphenyl (CBP) or N,N-dicarbazolyl-3,5-benzene (mCP). Further, the light emitting layer 139c may be formed of a phosphorescence material including a dopant material including one or more selected from the group consisting of PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum) or a fluorescence material including PBD:Eu(DBM)3(Phen) or Perylene, but is not limited thereto.

In case that the light emitting layer 139c produces green light, the light emitting layer 139c includes a host material including CBP or mCP. Further, the light emitting layer 139c may be formed of a phosphorescence material including a dopant material including Ir(ppy)3(fac tris(2-phenylpyridine)iridium) or a fluorescence material including Alq3(tris(8-hydroxyquinolino)aluminum), but is not limited thereto.

In case that the light emitting layer 139c produces blue light, the light emitting layer 139c includes a host material including CBP or mCP. Further, the light emitting layer 139c may be formed of a phosphorescence material including a dopant material including (4,6-F2 ppy)2Irpic or a fluorescence material including any one selected from the group consisting of spiro-DPVBi, spiro-6P, distyryl-benzene (DSB), distyryl-arylene (DSA), PFO-based polymers, and PPV-based polymers, but is not limited thereto.

An electron transport layer 139d may be disposed on the light emitting layer 139c. The electron transport layer 139d functions to facilitate the transportation of electrons. The electron transport layer 139d may be formed of one or more selected from the group consisting of Alq3(tris(8-hydroxyquinolino)aluminum, PBD, TAZ, spiro-PBD, BAlq, and SAlq, but is not limited thereto.

An electron injection layer 139e may be disposed on the electron transport layer 139d. The electron injection layer 139e functions to facilitate the injection of electrons. The electron injection layer 139e may be formed of Alq3(tris(8-hydroxyquinolino)aluminum), PBD, TAZ, spiro-PBD, BAlq or SAlq, but is not limited thereto.

Here, the present invention is not limited to FIG. 11. At least one of the electron injection layer 139a, the electron transport layer 139b, the hole transport layer 139d, the hole injection layer 139e may be omitted.

Meanwhile, materials which can be commonly used in the manufacture of the display devices as shown in FIGS. 7 to 10 are as follows.

The gate 115 may be formed of any one selected from the group consisting of molybdenum (Mo), aluminum (Al), chromium (Cr), gold (Au), titanium (Ti), nickel (Ni), neodymium (Nd) and copper (Cu), or a combination thereof. The gate 115 may have a multi-layered structure formed of Mo, Al, Cr, Au, Ti, Ni, Nd, or Cu, or a combination thereof. The gate 115 may have a double-layered structure including Mo/Al—Nd or Mo/Al.

The first insulating film 120 may include a silicon oxide (SiOx) film, a silicon nitride (SiNx) film, or a multi-layered structure, but is not limited thereto.

The source 133a and drain 133b may have a single-layered structure or a multi-layered structure. When the source 133a and drain 133b have the single-layered structure, the source 133a and drain 133b may be formed of any one selected from the group consisting of molybdenum (Mo), aluminum (Al), chromium (Cr), gold (Au), titanium (Ti), nickel (Ni), neodymium (Nd) and copper (Cu), or a combination thereof. When the source 133a and drain 133b have the multi-layered structure, the source 133a and drain 133b may have a double-layered structure including Mo/Al—Nd or a triple-layered structure including Mo/Al/Mo or Mo/Al—Nd/Mo.

The second insulating film 135 may include a silicon oxide (SiOx) film, a silicon nitride (SiNx) film, or a multi-layered structure, but is not limited thereto. The second insulating film 135 may be a passivation film.

The first electrode 137 may be formed of any one of indium-tin-oxide (ITO), indium-zinc-oxide (IZO), and zinc oxide (ZnO).

As seen from above, the one exemplary embodiment of the present invention can provide a manufacturing method for a display device which shows excellent driving capability and reliability by suppressing micro-peeling between an active layer and an impurity layer upon formation of a transistor, and making it easier to manufacture an advanced transistor employing an SPC film as an active layer.

The foregoing embodiments and advantages are merely exemplary and are not to be construed as limiting the present invention. The present teaching may be readily applied to other types of apparatuses. The description of the foregoing embodiments is intended to be illustrative, and not to limit the scope of the claims. Many alternatives, modifications, and variations will be apparent to those skilled in the art. In the claims, means-plus-function claims are intended to cover the structures described herein as performing the recited function and not only structural equivalents, but also equivalent structures. Moreover, unless the term "means" is explicitly recited in a limitation of the claims, such limitation is not intended to be interpreted under 35 USC 112(6).

The invention claimed is:

1. A manufacturing method for a display device, comprising:
   forming an active layer by performing an SPC (solid phase crystallization) process on a first substrate;
   forming a cushioning layer of amorphous silicon (a-Si) on the active layer under an atmosphere containing 90 to 97% by flow rate of hydrogen (H2) and 10 to 3% by flow rate of silane (SiH4);
   forming an N-type impurity layer on the cushioning layer;
   forming a metal layer to cover the N-type impurity layer;
   forming a source and drain by removing the metal film by a first etching method; and
   separating the N-type impurity layer and the cushioning layer by a second etching method, wherein the thickness of the cushioning layer is 10 to 300 Å, and wherein the cushioning layer, the N-type impurity layer and the metal layer are formed successively.

2. The method of claim 1, after the formation of the active layer, comprising removing a thermal oxide film formed upon crystallization of the active layer by BOE (buffered oxide etchant) cleaning.

3. The method of claim 1, before the formation of the active layer, comprising forming a gate on the first substrate, and forming a first insulating film on the gate.

4. The method of claim 3, comprising forming a second insulating film on the source and drain, and forming a first electrode on the second insulating film to be connected to the source or drain.

5. The method of claim 4, comprising forming a display panel by providing a second substrate spaced apart from and opposed to the first substrate and bonding the first and second substrates.

6. The method of claim 5, wherein the display panel comprises a liquid crystal layer between the first substrate and the second substrate and a black matrix and color filter disposed on the second substrate.

7. The method of claim 5, wherein the display panel comprises an organic light emitting layer disposed on the first electrode and a second electrode disposed on the organic light emitting layer.

8. The method of claim 1, after the separation, comprising forming a first insulating film on the source and drain, and forming a gate on the first insulating film.

9. The method of claim 8, comprising forming a second insulating film on the first insulating film so as to cover the gate, and forming a first electrode on the second insulating film to be connected to the source or drain.

10. The method of claim 9, comprising forming a display panel by providing a second substrate spaced apart from and opposed to the first substrate and bonding the first and second substrates.

11. The method of claim 10, wherein the display panel comprises a liquid crystal layer between the first substrate and the second substrate and a black matrix and color filter disposed on the second substrate.

12. The method of claim 10, wherein the display panel comprises an organic light emitting layer disposed on the first electrode and a second electrode disposed on the organic light emitting layer.

* * * * *